United States Patent
Amthor et al.

(10) Patent No.: US 10,509,086 B2
(45) Date of Patent: Dec. 17, 2019

(54) MAGNETIC RESONANCE FINGERPRINTING DICTIONARY GENERATION USING A SUPPLEMENTARY MAGNETIC FIELD COIL

(71) Applicant: KONINKLIJKE PHILIPS N.V., Eindhoven (NL)

(72) Inventors: Thomas Erik Amthor, Eindhoven (NL); Peter Boernert, Eindhoven (NL); Mariya Ivanova Doneva, Eindhoven (NL); Wim Crooijmans, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 56 days.

(21) Appl. No.: 15/735,422

(22) PCT Filed: Jun. 8, 2016

(86) PCT No.: PCT/EP2016/062927
§ 371 (c)(1),
(2) Date: Dec. 11, 2017

(87) PCT Pub. No.: WO2016/198415
PCT Pub. Date: Dec. 15, 2016

(65) Prior Publication Data
US 2018/0180692 A1 Jun. 28, 2018

(30) Foreign Application Priority Data

Jun. 12, 2015 (EP) .................................. 15171868

(51) Int. Cl.
*G01R 33/46* (2006.01)
*G01R 33/30* (2006.01)
(Continued)

(52) U.S. Cl.
CPC ......... *G01R 33/4625* (2013.01); *G01R 33/30* (2013.01); *G01R 33/31* (2013.01);
(Continued)

(58) Field of Classification Search
CPC ........ G01R 33/30; G01R 33/31; G01R 33/36; G01R 33/3875; G01R 33/389;
(Continued)

(56) References Cited

U.S. PATENT DOCUMENTS

2007/0052419 A1  3/2007 Overweg
2013/0265047 A1  10/2013 Griswold et al.
(Continued)

OTHER PUBLICATIONS

Jiang, Yun, et al. "MR fingerprinting using fast imaging with steady state precession (FISP) with spiral readout." Magnetic resonance in medicine 74.6 (2014): 1621-1631. (Year: 2014).* resonance fingerprinting technique; and appending (206) the dictionary magnetic resonance data to a magnetic resonance fingerprinting dictionary (156).

16 Claims, 6 Drawing Sheets

*Primary Examiner* — Rishi R Patel

(57) ABSTRACT

The invention provides for a method of operating an instrument (100). The instrument comprises a magnetic resonance system (102) for measuring dictionary magnetic resonance data (154) from a measurement zone (108). The magnetic resonance system comprises a magnet (104) for generating a main magnetic field within the measurement zone. The magnetic resonance system comprises a test fixture (124) for holding a test sample (132) within the measurement zone. The test fixture comprises a supplementary magnetic field coil (126) and a magnetic resonance antenna (128). The method comprises the steps of repeatedly: choosing (200) an electrical current; supplying (202) the electrical current to the supplementary magnetic field coil to adjust the main magnetic field within the measurement zone; acquiring (204) the dictionary magnetic resonance data from the test sample with the magnetic resonance antenna by controlling the magnetic resonance system according to a magnetic (51) Int. Cl.
| | | |
|---|---|---|
| *G01R 33/31* | (2006.01) | |
| *G01R 33/3875* | (2006.01) | |
| *G01R 33/389* | (2006.01) | |
| *G01R 33/36* | (2006.01) | |
| *G01R 33/465* | (2006.01) | |
| *G01R 33/48* | (2006.01) | |

(52) U.S. Cl.
CPC ............ *G01R 33/36* (2013.01); *G01R 33/389* (2013.01); *G01R 33/3875* (2013.01); *G01R 33/465* (2013.01); *G01R 33/4828* (2013.01)

(58) Field of Classification Search
CPC .............. G01R 33/4625; G01R 33/465; G01R 33/4828; G01R 33/54; G01R 33/50; G01R 33/5608

See application file for complete search history.

(56) References Cited

U.S. PATENT DOCUMENTS

| | | |
|---|---|---|
| 2013/0271132 A1 | 10/2013 | Griswold |
| 2016/0282436 A1* | 9/2016 | Cloos ..................... A61B 5/055 |

OTHER PUBLICATIONS

Dan Ma et al: "Magnetic resonance fingerprinting",Nature,vol. 495, No. 7440,Mar. 13, 2013 (Mar. 13, 2013), pp. 187-192.

Jiang et al "MR Fingerprinting Using Spiral Quest" Proc. Intl. Soc. Mag. Reson. Med. 21 (2013) p. 0019.

Christen et al "MR Fingerprinting and B0 Inhomogeneities" Proceedings of the International Society for Magnetic Resonance in Medicine, 23nd Annual Meeting vol. 23, May 15, 2015 p. 3236.

Wang C Y et al: "Efficient Quantification of Metabolite Concentration and T1Relaxation by 31P Spectroscopic Magnetic Resonance",Proceedings of the International Society for Magnetic Resonance in Medicine, 23nd Annual Meeting and Exhibition, Toronto,Canada, May 30-Jun. 5, 2015, vol. 23, May 15, 2015 (May 15, 2015), p. 56.

Jiang Y et al: "Simultaneous TI and T2 quantification of the Human Brain at 7 Tesla by MR Fingerprinting", Proceedings of the International Society for Magnetic Resonance in Medicine, 23nd Annual Meeting and Exhibition, Toronto,Canada, May 30-Jun. 5, 2015,vol. 23.

Christen T et al: "MR vascular Fingerprinting: A new approach to compute cerebral blood volume, mean vessel radius.and oxygenation maps in the human brain".NEUROIMAGE,vol. 89, Nov. 7, 2013 (Nov. 7, 2013),pp. 262-270.

* cited by examiner

MAGNETIC RESONANCE FINGERPRINTING DICTIONARY GENERATION USING A SUPPLEMENTARY MAGNETIC FIELD COIL

CROSS REFERENCE TO RELATED APPLICATIONS

This application is a U.S. national phase application of International Application No. PCT/EP2016/062927, filed on Jun. 8, 2016, which claims the benefit of EP Application Serial No. 15171868.1 filed on Jun. 12, 2015 and is incorporated herein by reference.

TECHNICAL FIELD OF THE INVENTION

The invention relates to magnetic resonance imaging and spectroscopy, in particular to methods and devices for the construction of dictionaries for magnetic resonance fingerprinting.

BACKGROUND OF THE INVENTION

Magnetic Resonance (MR) fingerprinting is a new technique where a number of RF pulses, distributed in time, are applied such that they cause signals from different materials or tissues to have a unique contribution to the measured MR signal. A limited dictionary of precalculated signal contributions from a set or fixed number of substances is compared to the measured MR signals and within a single voxel the composition can be determined. For example if it is known that a voxel only contains water, fat, and muscle tissue the contribution from these three materials need only be considered and only a few RF pulses are needed to accurately determine the composition of the voxel. If a larger dictionary with higher resolution is used, MR fingerprinting can be used to determine different tissue parameters of a voxel (such as T1, T2, . . . ) simultaneously and quantitatively.

The magnetic resonance fingerprinting technique was introduced in the journal article Ma et al., "Magnetic Resonance Fingerprinting," Nature, Vol. 495, pp. 187 to 193, doi:10.1038/nature11971. The magnetic fingerprinting technique is also described in United States patent applications US 2013/0271132 A1 and US 2013/0265047 A1.

The conference proceeding Jiang et al., "MR Fingerprinting Using Spiral QUEST," Proc. Intl. Soc. Mag. Reson. Med. 21 (2013), p. 0019, discloses Magnetic Resonance Fingerprinting (MRF) by using the QUick Echo Split imaging Technique (QUEST) as a building block for MRF sequences. In the ISMRM-abstract 2015 p. 3236 'MR fingerprinting and B0 inhomogeneities' a magnetic resonance fingerprinting technique is discussed in which the effects of virtual linear shim gradients are added to the dictionaries.

SUMMARY OF THE INVENTION

The invention provides for a method of operating an instrument an instrument, and a computer program product in the independent claims. Embodiments are given in the dependent claims.

The Nature article by Ma et al. introduces the basic idea of magnetic resonance fingerprinting and terminology which is used to describe this technique such as the dictionary, which is referred to herein as a a "magnetic resonance fingerprinting dictionary," or simply a "dictionary."

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a method of operating an instrument. The instrument comprises a magnetic resonance imaging system for measuring magnetic resonance data from a measurement zone. A magnetic resonance imaging system may for example be a nuclear magnet resonance spectrometer or a magnetic resonance imaging system. A measurement zone as used herein encompasses a region with a magnetic field strong enough and sufficiently uniform enough for performing NMR spectroscopy or magnetic resonance imaging. The magnetic resonance system comprises a magnet for generating a main magnetic field within the measurement zone.

The main magnetic field is often also referred to as a B0 field or magnetic field. The instrument further comprises a test fixture for holding a test sample within the measurement zone. In some instances the test fixture may be removable from the magnet. In other embodiments the test fixture is permanently mounted within the magnet. The test fixture comprises a supplementary magnetic field coil and a magnetic resonance antenna. Within the measurement zone the magnet will generate the main magnetic field. The supplementary magnetic field coil is used to modify the magnetic field within the measurement zone. The test fixture further comprises a magnetic resonance antenna. The magnetic resonance antenna may be used for measuring the magnetic resonance data from the measurement zone.

The method comprises the step of repeatedly choosing an electrical current from a distribution of electrical currents. The method further comprises repeatedly supplying the electrical current to the supplementary magnetic field coil to adjust the main magnetic field within the measurement zone. The method further comprises repeatedly acquiring dictionary magnetic resonance data from the test sample with the magnetic resonance antenna by controlling the magnetic resonance system with pulse sequence commands during the supplying of the electrical current to the supplementary magnetic field coil. The dictionary magnetic resonance data is magnetic resonance data that has been labeled or named as dictionary magnetic resonance data for the purpose of distinguishing it from other magnetic resonance data that may be used or described later.

The pulse sequence commands cause the magnetic resonance system to acquire the dictionary magnetic resonance data according to a magnetic resonance fingerprinting technique. The pulse sequence commands specify a train of pulse sequence repetitions. Each pulse sequence repetition has a repetition time chosen from a distribution of repetition times. Each pulse sequence repetition comprises a radio-frequency pulse sequence chosen from a distribution of radio-frequency pulses. The distribution of radio-frequency pulses causes magnetic spins to rotate to a distribution of flip angles. Each pulse sequence repetition comprises a sampling event where the magnetic resonance signal is sampled for a predetermined duration at a sampling time before the end of the pulse sequence repetition. The sampling time is chosen from a distribution of sampling times. The dictionary magnetic resonance data is acquired during the sampling event. The method further comprises repeatedly appending the dictionary magnetic resonance data to a magnetic resonance fingerprinting dictionary.

This method may be beneficial because it provides for a magnetic resonance fingerprinting dictionary that may be later used to perform a magnetic resonance fingerprinting technique using the pulse sequence commands. Magnetic resonance fingerprinting dictionaries are typically constructed by solving the so called Bloch equations. Acquiring the magnetic resonance fingerprinting dictionary empirically may have the benefit of providing for a more accurate diagnostic tool. Acquiring the magnetic resonance fingerprinting dictionary empirically may also provide a mechanism for detecting deviation of the system state at later times compared to the system state at which the dictionary was acquired.

The test sample in the method may for example have a predetermined or known composition. In some examples the method may include changing the test sample to different samples of known composition so that a complete magnetic resonance fingerprinting dictionary can be constructed.

In some examples the gradient magnetic fields in a magnetic resonance imaging system could be used to perform the fucntion of the supplementary magnetic field coil to adjust the main magnetic field in the framework of the present invention. This may allow for a less expensive method of performing the method. In this case the sample may be very precisely positioned in the magnet or a magnetic field probe may be placed close to the sample.

However, using a supplementary magnetic field coil that has been inserted into the magnet may be beneficial because it enables a larger sample of the sample to be used. This may provide for a better signal-to-noise ratio and therefore a better magnetic resonance fingerprinting dictionary.

In other examples of the method gradient magnetic fields may be used to simulate the effects of inhomogeneities in the main magnetic field or B0 magnetic field.

Variations of the method may provide for testing a number of different test samples with different compositions. It may also be varied by repeating the method for a number of adjusted B0 or main magnetic fields, temperatures, and optionally adjusted gradient fields to simulate B0 inhomogeneities.

In some examples the measurement zone is an imaging zone of a magnetic resonance imaging system.

In another embodiment the magnetic resonance system is a nuclear magnetic resonance imaging system.

In another embodiment the magnetic resonance system is a nuclear magnetic resonance spectrometer.

In another embodiment the magnetic resonance antenna is a solenoid magnetic resonance antenna. The solenoid magnetic resonance antenna is configured for generating a B1 magnetic field in a sampling zone. The solenoid magnetic resonance imaging antenna is oriented such that the generated B1 magnetic field is perpendicular to the main magnetic field. The sampling zone is within the measurement zone. The test sample is within the sampling zone. In some examples the sampling zone may be as large as the measurement zone. In other examples the sampling zone is a subset or fraction of the measurement zone. This embodiment may have the benefit of providing for a more accurate magnetic resonance fingerprinting dictionary. The placement of a solenoid magnetic resonance antenna perpendicular to the field lines of the main magnetic field may provide for a better signal-to-noise ratio of the measurement of the dictionary magnetic resonance data.

In another embodiment the method further comprises placing a subject in a data acquisition zone of a magnetic resonance apparatus. The data acquisition zone is a measurement zone or imaging zone. The label "data acquisition zone" is used to indicate that the imaging or measurement zone of a different or distinct magnetic resonance imaging system or apparatus may be used used. The method can be performed with a single magnetic resonance system or the method may be split between multiple magnetic resonance systems. As such in some examples the magnetic resonance apparatus is the same as the magnetic resonance systems. In this case the measurement zone is identical with the data acquisition zone. For this example, the method may also comprise removing the test fixture and/or the sample from the magnetic resonance system In other examples, the magnetic resonance apparatus is distinct to the magnetic resonance system. In this case the measurement zone is different to the data acquisition zone.

The method further comprises acquiring subject magnetic resonance data by controlling the magnetic resonance system with pulse sequence instructions. The pulse sequence instructions cause the magnetic resonance apparatus to acquire the magnetic resonance data according to the magnetic resonance fingerprinting technique. The pulse sequence instructions specify the pulse sequence repetitions. In some examples the pulse sequence commands are identical with the pulse sequence instructions. In other examples the pulse sequence instructions vary from the pulse sequence commands. For example the pulse sequence commands may use a gradient magnetic field system to simulate the effects of B0 inhomogeneities in the main magnetic field. In this case the pulse sequence instructions would not be able to simulate these inhomogeneities. In other examples the pulse sequence instructions may also have phase or spatial encoding which is lacking in the pulse sequence commands.

The method further comprises calculating the abundance of each of a set of predetermined substances by comparing the subject magnetic resonance data with the magnetic resonance fingerprinting dictionary. The test sample belongs to the set of predetermined substances.

In some examples the magnetic resonance system and the magnetic resonance apparatus are identical. In other examples the magnetic resonance system and the magnetic resonance apparatus are different. For example the magnetic resonance system may be a particular nuclear magnetic resonance spectrometer or a magnetic resonance imaging system and the magnetic resonance apparatus is a distinct or different NMR spectrometer or magnetic resonance imaging system.

In another aspect the invention provides for an instrument comprising a magnetic resonance system for acquiring magnetic resonance data from a measurement zone. The magnetic resonance imaging system further comprises a magnet for generating a main magnetic field within the measurement zone. The instrument further comprises a test fixture for holding a test sample within the measurement zone. The test fixture comprises a supplementary magnetic field coil and a magnetic resonance imaging antenna. The instrument further comprises a memory for storing machine executable instructions and pulse sequence commands. The pulse sequence instructions cause the magnetic resonance system to acquire the dictionary magnetic resonance data according to a magnetic resonance fingerprinting technique.

The pulse sequence instructions specify a train of pulse sequence repetitions. Each pulse sequence repetition has a repetition time chosen from a distribution of repetition times. Each pulse sequence repetition comprises a radio-frequency pulse chosen from a distribution of radio-frequency pulses. The distribution of radio-frequency pulses causes magnetic spins to rotate to a distribution of flip angles. Each pulse sequence repetition comprises a sampling event where the magnetic resonance signal is sampled for a predetermined duration at a sampling time before the end of the pulse sequence repetition. The sampling time is chosen from a distribution of sampling times. The dictionary magnetic resonance data is acquired during the sampling event. The instrument further comprises a processor for controlling the instrument. Execution of the machine-executable instructions further causes the processor to repeatedly choose an electrical current from a distribution of electrical currents. Execution of the machine-executable instructions further causes the processor to repeatedly control the instrument to supply the electrical current to the supplementary magnetic field coil to adjust the main magnetic field of the test sample.

Execution of the machine-executable instructions further cause the processor to repeatedly acquire dictionary magnetic resonance data by controlling the magnetic resonance system with pulse sequence commands during the supplying of the electrical current to the supplementary magnetic field coil. Execution of the machine-executable instructions further causes the processor to repeatedly append the dictionary magnetic resonance data to a magnetic resonance fingerprinting dictionary. The advantages of such a system have been previously discussed in the context of the method of operating the instrument.

In some examples the instrument may comprise a power supply for supplying the current to the supplementary magnetic field coil. In other instances the power supply for supplying the current to the supplementary magnetic field coil may be the same power supply that is used for operating or supplying current to gradient magnetic field coils of a magnetic resonance imaging system.

In other examples the magnetic resonance fingerprinting dictionary is stored in the memory.

A further advantage of the above instrument and also the method is that more complicated magnetic resonance fingerprinting pulse sequences may be used than is currently possible. For example there may be gradient fields which are applied during the radio-frequency pulse. Also a typical approximation when calculating magnetic resonance fingerprinting dictionaries is that the radio-frequency pulse is short enough so that it can be approximated as a instantaneous radio-frequency pulse. Use of the instrument or of the method of operating the instrument may provide for a means of using longer radio-frequency pulses without having to do complicated or possibly incorrect calculations of what the magnetic resonance fingerprinting dictionary should be.

In another embodiment the magnetic resonance system further comprises a magnetic gradient system configured for generating a gradient magnetic field in at least one direction. The magnetic gradient system for example may comprise a set of magnetic gradient coils and a magnetic gradient coil power supply.

In another embodiment execution of the machine-executable instructions further causes the processor to repeatedly choose a B0 inhomogeneity profile from a distribution of B0 inhomogeneity profiles. Execution of the machine-executable instructions further causes the processor to repeatedly control the magnetic gradient system to generate a constant gradient magnetic field to simulate the B0 inhomogeneity profile. The dictionary magnetic resonance data is acquired during the generation of the constant gradient magnetic field. This embodiment may have the benefit that inhomogeneities in the main magnetic field or B0 magnetic field may be accurately simulated and empirically measured.

In another embodiment the magnetic resonance system is a magnetic resonance imaging system. The magnetic field gradient system is configured for generating a gradient magnetic field or fields in three orthogonal directions. The magnetic field gradient system is further configured for generating a phase encoding gradient magnetic field within the measurement zone to spatially encode the magnetic resonance data in at least one of the three directions during the sampling event. The spatial encoding divides the magnetic resonance data into discreet voxels.

In another embodiment execution of the machine-executable instructions further causes the processor to calculate at least a portion of magnetic resonance fingerprinting dictionary by modeling each of a set of predetermined substances as one or more spins with selected Bloch equations. This embodiment may be beneficial because the magnetic resonance fingerprinting dictionary can be constructed empirically and also through the use of calculations with the Bloch equations.

In another embodiment the pulse sequence commands comprise instructions to vary the gradient magnetic fields during the application of at least one of the radio-frequency pulses of the at least one pulse sequence repetition. This embodiment may be beneficial because to calculate the effects of varying the gradient magnetic fields during the application of the at least one radio-frequency pulse would be extremely difficult. It may be theoretically hard to calculate due to multiple coherences. In this embodiment the effects of varying the gradient magnetic field during the application of the at least one radio-frequency pulse may be empirically measured. This enables magnetic resonance fingerprinting protocols or sequences to be used which would normally not be able to be performed.

In another embodiment the pulse sequence commands comprise instructions that cause the radio-frequency pulse of at least one pulse sequence repetition to be longer than 15 ms or even longer than 50 ms. In this case the radio-frequency pulse is approximately on the order of a spin relaxation time. With a radio-frequency pulse of such a long duration it would be time-consuming to accurately calculate the magnetic resonance fingerprinting dictionary using the Bloch equations. This embodiment therefore performs a way of making a magnetic resonance fingerprinting dictionary for pulse sequences which would normally not be able to be used for magnetic resonance fingerprinting.

In this embodiment we can represent the sequences of series of instantaneous flips and relaxations without having to bother with the evaluation of the system during the radio-frequency pulses. Using the approximation or the empirical measurements it is not needed to solve the differential equations for the whole sequence but instead use known solutions of separate evolution steps for example short pulses and long relaxation periods.

In another embodiment execution of the machine-executable instructions further cause the processor to numerically fit a solution of initial Bloch equations to the dictionary of magnetic resonance data to generate a set of corrected Bloch equations. The corrected Bloch equations may for example have parameters that have been adjusted or changes. For example modifying the values of T1, T2, B0, and other values may result in a more accurate calculation.

Execution of the machine-executable instructions further causes the processor to repeatedly modify at least one parameter of the corrected Bloch equations. Execution of the machine-executable instructions further causes the processor to repeatedly solve the corrected Bloch equations to generate calculated magnetic resonance data. Execution of the machine-executable instructions further causes the processor to repeatedly append the calculated magnetic resonance data to the magnetic resonance fingerprinting dictionary. In this example the Bloch equations are numerically fit to empirically measured data. These corrected Bloch equations can then be used to model additional conditions to expand the magnetic resonance fingerprinting dictionary. In this way the empirical measurements can be used to improve calculated portions of the magnetic resonance fingerprinting dictionary.

In another embodiment the test fixture comprises a sample holder for receiving the test sample. The sample holder is removable from the test fixture. The sample holder is any one of the following: disposable, sterilizable, supplied in a sterile packaging, and combinations thereof.

In another embodiment the instrument further comprises a temperature control system for controlling the temperature of the test sample during acquisition of the dictionary magnetic resonance data. This may be beneficial because the temperature of the sample can be varied and this may become a portion of the magnetic resonance fingerprinting dictionary.

In another embodiment execution of the machine-executable instructions further cause the processor to repeatedly choose a measurement temperature from a distribution of temperatures. Execution of the machine-executable instructions further cause the processor to repeatedly control the temperature control system to maintain the test sample at the measurement temperature or within a predetermined range of the instrument temperature. The dictionary magnetic resonance data is acquired when the test samples are within a predetermined temperature range that includes the measurement temperature.

In another embodiment the temperature control system is any one of the following: a forced air temperature control system, an electric heater, a thermoelectric element, and a fluid temperature control system such as a fluid heater or chiller.

In another embodiment the test fixture further comprises a magnetic field sensor for measuring a measured magnetic field strength within the imaging zone. The electric current is specified as a desired magnetic field strength. Execution of the machine-executable instructions further causes the processor to control the magnetic field sensor to measure the magnetic field strength. Execution of the machine-executable instructions further cause the processor to control the instrument to adjust the electrical current to the supplementary magnetic field coil such that the difference between the measured magnetic field strength and the desired magnetic field strength is below a predetermined amount. This may provide for an improved magnetic resonance fingerprinting dictionary.

In another aspect the invention provides for a computer program product comprising machine-executable instructions for execution by a processor controlling an instrument. The instrument comprises a magnetic gradient system for measuring magnetic resonance data from a measurement zone. The magnetic resonance system comprises a magnet for generating a main magnetic field within the measurement zone. The instrument further comprises a test fixture for holding a test sample within the measurement zone. The test comprises a supplementary magnetic field coil and a magnetic resonance imaging antenna. Execution of the machine-executable instructions further causes the processor to repeatedly choose an electric current from a distribution of electrical currents. Execution of the machine-executable instructions further cause the processor to control the instrument to supply the electrical current to the supplementary magnetic field coil to adjust the main magnetic field of the test sample.

Execution of the machine-executable instructions further cause the processor to acquire dictionary magnetic resonance data by controlling the magnetic resonance system with pulse sequence commands during the supplying of the electrical current to the supplementary magnetic field coil. The pulse sequence commands cause the magnetic resonance system to acquire the dictionary magnetic resonance data according to a magnetic resonance fingerprinting technique. The pulse sequence instructions specify a train of pulse sequence repetitions. Each pulse sequence repetition has a repetition time chosen from a distribution of repetition times. Each pulse sequence repetition comprises a radio-frequency pulse chosen from a distribution of radio-frequency pulses. The distribution of radio-frequency pulses causes magnetic spins to rotate to a distribution of flip angles.

Each pulse sequence repetition comprises a sampling event where the magnetic resonance signal is sampled for a predetermined duration at a sampling time before the end of the pulse sequence repetition. The sampling time is chosen from a distribution of sampling times. The dictionary magnetic resonance data is acquired during the sampling event. Execution of the machine-executable instructions further causes the processor to append the dictionary magnetic resonance data to a magnetic resonance fingerprinting dictionary.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
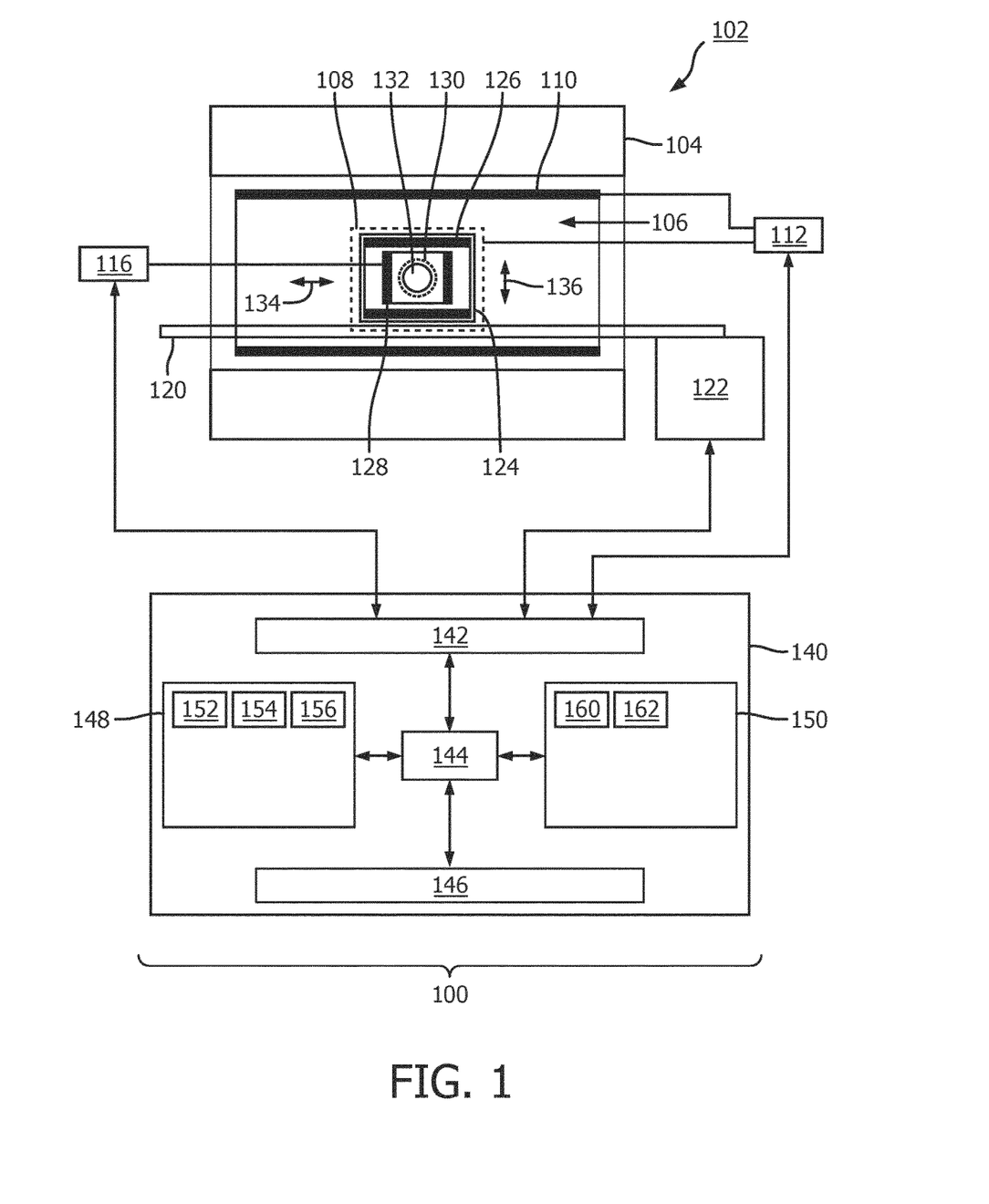
FIG. 1 illustrates an example of a magnetic resonance system.

FIG. 1 illustrates an example of an instrument 100. The instrument 100 comprises a magnetic resonance system 102. In this example the magnetic resonance system 102 is a magnetic resonance imaging system. However, the magnetic resonance system 102 could also be a nuclear magnetic resonance spectrometer. The magnetic resonance system 102 has a magnet 104. The magnet 104 is a superconducting cylindrical type magnet 104 with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections is similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Within the bore of the magnet 106 there is a test fixture 124 that is placed on a subject support 120. The test fixture 124 is shown as being in this case completely within the measurement zone 108. This is however only one example. The test fixture 124 could also be larger than the measurement zone 108. The test fixture 124 could also be permanently mounted within the bore 106 of the magnet 104. Various components shown in FIG. 1 may be missing if the magnetic resonance system 102 is instead a nuclear magnetic resonance spectrometer. For example the gradient coils 110 may not be present.

The test fixture 124 is shown as containing a supplementary magnetic field coil 126 that is able to adjust the strength of the main magnetic field. Within the supplementary magnetic field coil 126 there is a magnetic resonance antenna 128 which has a sampling zone 130. The sampling zone 130 is the region where the magnetic resonance antenna 128 has a sensitivity sufficient for measuring magnetic resonance data or generating a B1 magnetic field. A test sample 132 is shown as being positioned by the test fixture 124 within the sampling zone 130. The test sample 132 may have a known composition. The magnetic resonance antenna 128 in this example is a solenoidal magnetic resonance antenna and generates a B1 magnetic field in the direction labeled 136. The arrows 134 indicate the orientation of the field lines generated by the magnet 104.

In this particular example shown in FIG. 1 the arrows 134 are perpendicular to the arrows 136. It is not necessary to use a solenoidal magnetic resonance antenna or to orient a solenoidal magnetic resonance antenna as is illustrated in FIG. 1 but the orientation shown in FIG. 1 leads to a higher signal-to-noise ratio than when the coil 128 is oriented otherwise.

The magnetic resonance antenna 128 is shown as being connected to a transceiver 116 of the magnetic resonance imaging system 102. The supplementary magnetic field coil 126 is shown as being connected to the magnetic field gradient coil power supply 112. In other examples the supplementary magnetic field coil 126 may have its own power supply.

The subject support 120 is attached to an optional actuator 122 that is able to move the subject support and the subject 118 through the imaging zone 108. In this way a larger portion of the subject 118 or the entire subject 118 can be imaged. The transceiver 116, the magnetic field gradient coil power supply 112 and the actuator 122 are all see as being connected to a hardware interface 128 of computer system 126. The hardware interface 142 is connected to processor 144. The processor 144 is also connected to a user interface 146, computer storage 148, and computer memory 150.

The computer storage 148 is shown as containing pulse sequence commands 152. The pulse sequence commands 152 cause the magnetic resonance system 102 to acquire the dictionary magnetic resonance data 154 according to a magnetic resonance fingerprinting technique. The pulse sequence commands specify a train of pulse sequence repetitions. Each pulse sequence repetition has a repetition time chosen from a distribution of repetition times. Each pulse sequence repetition comprises a radio-frequency pulse sequence chosen from a distribution of radio-frequency pulses. The distribution of radio-frequency pulses cause magnetic spins to rotate to a distribution of flip angles. Each pulse sequence repetition comprises a sampling event where the magnetic resonance signal is sampled for a predetermined duration at a sampling time before the end of the pulse sequence repetition. The sampling time is chosen from a distribution of sampling times. The dictionary magnetic resonance data is acquired during the sampling event.

The computer storage 140 is further shown as containing dictionary magnetic resonance data 154 that was acquired using the pulse sequence commands 152 to control the magnetic resonance imaging system 102. The computer storage 140 is further shown as containing a magnetic resonance fingerprinting dictionary 156 that was constructed from various amounts of dictionary magnetic resonance data 154.

The computer memory 150 is shown as containing a control module 160. The control module 160 contains computer-executable code which enables the processor 144 to control the operation and function of the instrument 100. For instance the control module 160 may implement various methods of controlling the instrument and may enable the processor 144 to use the pulse sequence commands 152 to control the magnetic resonance imaging system 102. The computer memory 150 is further shown as containing a magnetic resonance fingerprint dictionary generating module 162. In different examples this module 162 may have different functions. For example the module 162 may construct the magnetic resonance fingerprinting dictionary 156 from acquired dictionary magnetic resonance data 154.

In other examples the magnetic resonance fingerprint dictionary generating module 162 may also model additional magnetic resonance fingerprinting dictionary entries using the Bloch equations. In yet other examples the magnetic resonance fingerprint dictionary generating module 162 may fit the Bloch equations to acquire dictionary magnetic resonance data 154 and then vary the conditions to calculate additional entries for the magnetic resonance fingerprinting dictionary 156.

Figure 2:
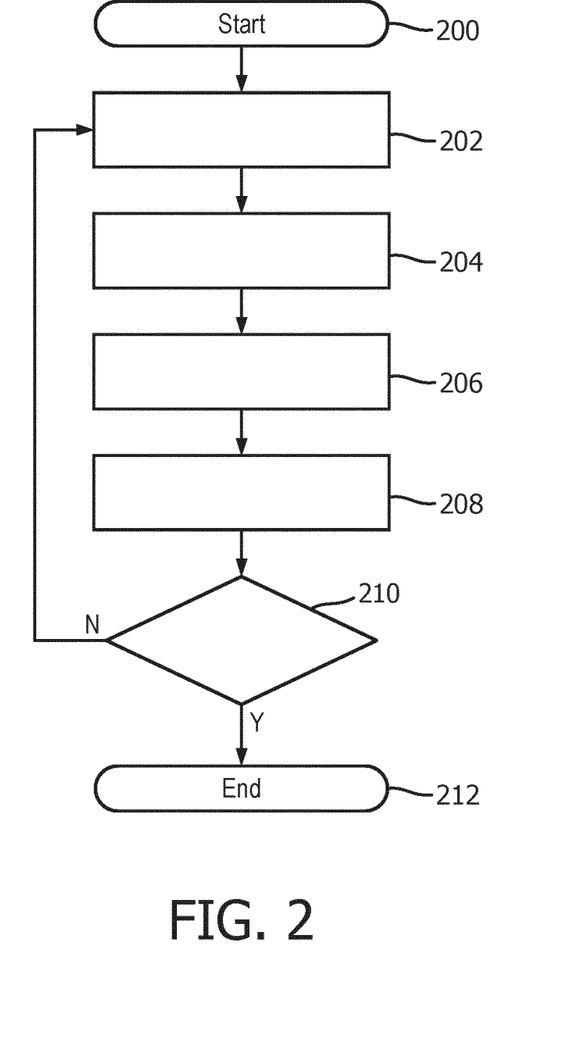
FIG. 2 shows a flow chart which illustrates a method of operating the magnetic resonance system of FIG. 1.

FIG. 2 shows a flowchart which illustrates a method of operating the instrument 100 of FIG. 1. The method starts in step number 200. Next in step 202 an electrical current is chosen from a distribution of electrical currents. This for instance may be implemented by the control module 160. Next in step 204 electrical current is supplied to the supplementary magnetic field coil 126 to adjust the main magnetic field within the measurement zone 108. Again, in the example shown in FIG. 1 the scale of the test fixture 124 relative to the magnetic resonance imaging system 102 is not intended to be accurate. In some examples the measurement zone 108 may be completely within the supplementary magnetic field coil 126.

Next in step 206 dictionary magnetic resonance data 154 is acquired by controlling the magnetic resonance imaging system 102 with the pulse sequence commands 152. Next in step 208 the dictionary magnetic resonance data 154 is appended to the magnetic resonance fingerprinting dictionary 156. The method then proceeds to step 210 which is a decision box. The question is have all variations of the electrical current been acquired. If the answer is no then the method returns to step 202 and a new electrical current is selected from the distribution of electrical currents. If the answer is yes then the method ends at step 212.

Figure 3:
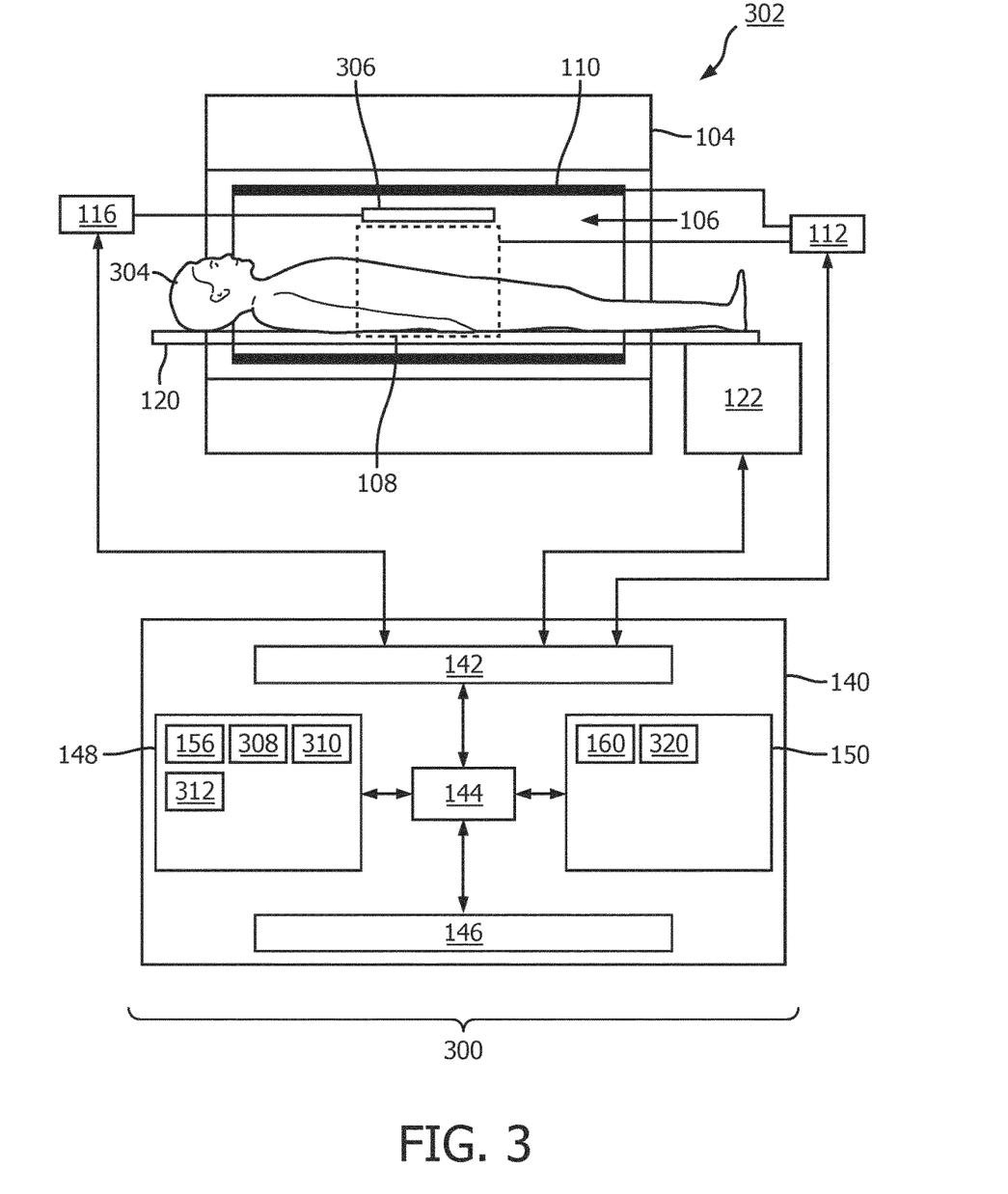
FIG. 3 illustrates an example of a magnetic resonance apparatus.

FIG. 3 shows a further example of an instrument 300. The instrument 300 in FIG. 3 is similar to that shown in FIG. 1. In this example the text fixture 124 is not within the bore 106 of the magnet 104. Instead a subject 304 is reposing on the subject support 120 and a portion of the subject 304 is within the imaging zone 108. There is a magnetic resonance imaging antenna 306 adjacent to the subject 304. The magnetic resonance imaging antenna 306 is connected to the transceiver 116.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels.

The magnetic resonance imaging antenna 306 is intended to be representative of various types and configurations of magnetic resonance imaging antennas. It is intended that the antenna 306 could also represent multi-element antennas connected via separate channels to the transceiver 116. The instrument 300 could be identical with the instrument 100 of FIG. 1 and the features could be combined. For example the magnetic resonance dictionary 156 could be constructed using the test fixture 124 and then the test fixture is removed so that subjects 304 can be imaged using magnetic resonance fingerprinting in the same magnetic resonance imaging system 302. In this case the magnetic resonance imaging system 302 of FIG. 3 may be identical with the magnetic resonance system 102 of FIG. 1.

The computer storage 148 is shown as containing the magnetic resonance fingerprinting dictionary 156 of FIG. 1. The computer storage 148 is further shown as containing pulse sequence instructions 308. The pulse sequence instructions 308 in some cases may be identical with the pulse sequence commands of FIG. 1. They however do not need to be identical. In constructing the magnetic resonance fingerprinting dictionary it may not be necessary to have spatial encoding. In this case the pulse sequence instructions 308 may vary from the pulse sequence commands of FIG. 1 in that the pulse sequence instructions 308 additionally contain commands for controlling the gradients 110 such that the subject magnetic resonance data 310 has spatial encoding which enables an image or spatially resolved data to be constructed.

The computer storage 140 is further shown as containing the subject magnetic resonance data 310 that was acquired using the pulse sequence instructions 308. Pulse sequence instructions and pulse sequence commands as used herein are intended to be either instructions or data which can be converted into instructions for controlling the magnetic resonance imaging system 102 or 302. The computer storage 148 is further shown as containing a magnetic resonance fingerprinting image data 312 that was constructed from the subject magnetic resonance data 310 and the magnetic resonance imaging fingerprinting dictionary 156. The computer memory 150 is shown as containing a magnetic resonance fingerprinting module 320 which enables a processor 144 to construct the magnetic resonance fingerprinting image data 312 from the subject magnetic resonance data 310 and the magnetic resonance fingerprinting dictionary 156. In the example shown in FIGS. 1 and 3 it is possible that the contents of the memories 148 and 150 are combined. Furthermore, it is possible for the contents of 148 and 150 to be exchanged or duplicated within each other. The example of FIG. 1 and/or FIG. 3 could be modified so that the magnetic resonance imaging system or apparatus 100 is equivalent to a Nuclear Magnetic Resoancne (NMR) spectometer. Without gradient coils 110 the instrument 100, 300 would perform a 0-dimensional measurement in the imaging zone 108.

Figure 4:
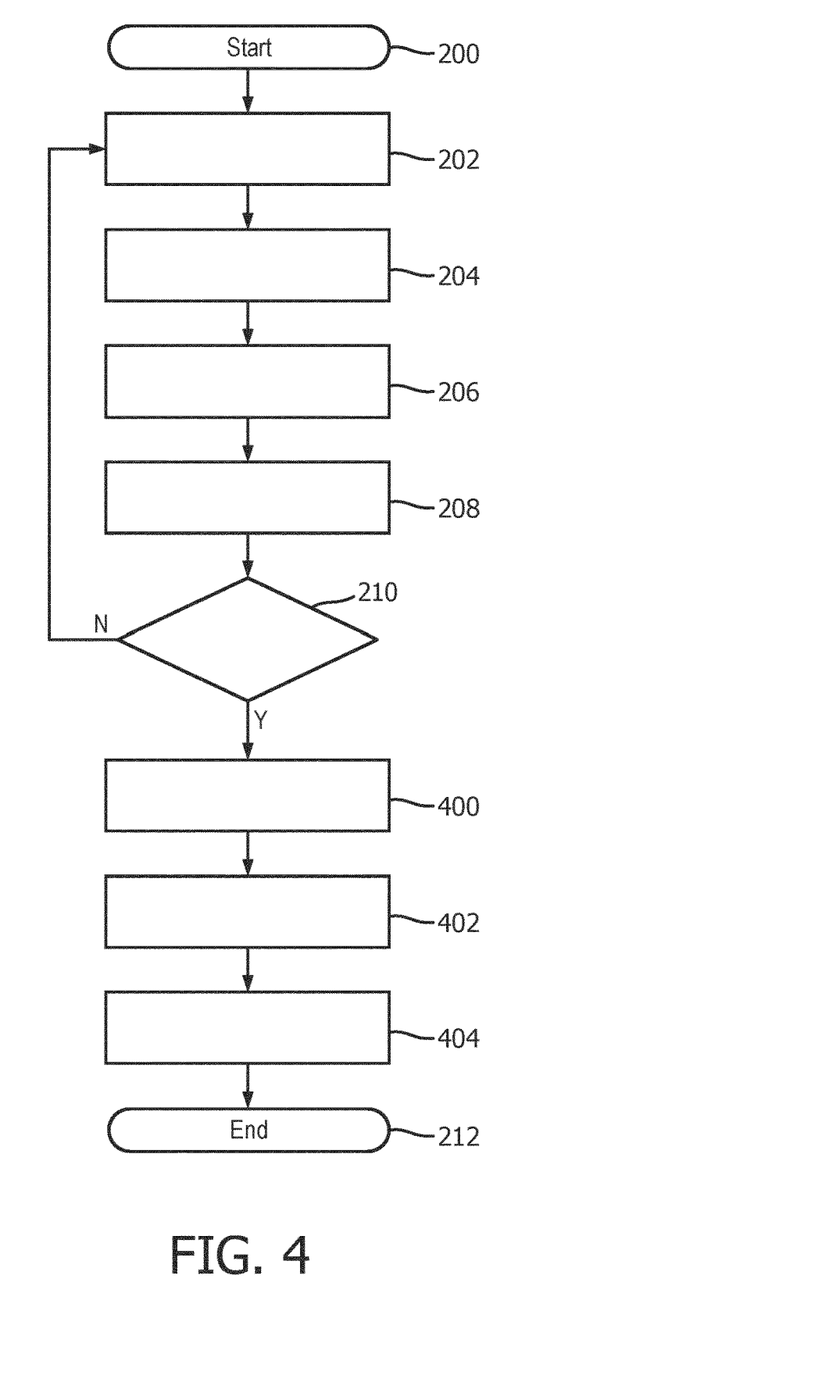
FIG. 4 shows a flow chart which illustrates a method of operating the magnetic resonance apparatus of FIG. 3 and the magnetic resonance system of FIG. 1.

FIG. 4 shows a flowchart which shows additional steps of the flowchart of FIG. 2. For steps 200-210 FIG. 4 is identical with FIG. 2. After the step 210 is performed all of the various parameters for the magnetic resonance fingerprinting dictionary 156 have been acquired and appended to the dictionary and the method proceeds to step 400. In step 400 the subject 304 is placed within the measurement zone 108. In some instances this may also involve removing the test fixture 124. Next in step 402 the subject magnetic resonance data 310 is acquired by controlling the magnetic resonance imaging system 302 with the pulse sequence instructions 308. Next in step 404 the abundance of each of the set of predetermined substances is calculated by comparing the subject magnetic resonance data 310 with the magnetic resonance fingerprinting dictionary 156. This results in the generation of the magnetic resonance fingerprinting image data 312. After step 404 the method proceeds to step 212 where the method ends.

Examples may describe a way to determine magnetic resonance fingerprint (MRF) signals empirically from in-vivo or ex-vivo tissue samples using a specially designed MRF apparatus and to build dictionaries from these signals. The apparatus allows obtaining high quality MRF signal responses from appropriate material- or tissue samples and allows generating those responses at different B0 field variations, temperature, etc. thereby producing a number of MRF dictionary entries for different environmental conditions. The dictionary can later be used along with others, conventional ones, generated by Bloch-simulations in a standard MRF setup to precisely characterize those tissues.

This new technique does not require the spin responses to be calculated in simulation software. It can thus be used to create more complex and unique fingerprints of real tissue and eventually may enable a kind of "MR histology".

Magnetic resonance fingerprinting (MRF) is a new and very promising technique for the determination of tissue types by comparing a measured MR signal response (the fingerprint), to a number of pre-calculated dictionary entries. It has been shown that even different tissue components within a voxel can be distinguished using this method. The method of MR fingerprinting promises a new quality of MR-based measurements which may enable applications of MR imaging which have not been possible so far.

The great potential of MRF lies in the fact that many tissue parameters are encoded in the signal at the same time. It is envisioned that precise tissue characterization, even "MR histology", may be possible in the future.

In conventional magnetic resonance fingerprinting, a dictionary of signals is generated by calculating the spin response to a fingerprint sequence based on a number of tissue parameters (such as T1, T2, etc.) and external parameters (such as B0 variations) using appropriate simulations via the Bloch equations. The fingerprint sequence must be designed in such a way that the signal response can be calculated in a reasonable time assuming that all relevant tissue parameters are known.

The dictionary must include entries for a large number of possible external parameter values that might influence an actual measurement to ensure a reliable match between experiential and simulated signals.

Tissue characterization could be more accurate and more robust, if more tissue parameters (such as diffusion, perfusion, conductivity, T2*, . . . ) were included in the fingerprint. However, this makes calculation often impractical or even impossible, and many parameters may not even be known in advance. Some tissues may show a high diversity and inhomogeneity also on a microscopic scale, making a simple parameter driven characterisation difficult.

This problem can be overcome by actually taking MR fingerprints from tissues or tissue samples (in-vivo/ex-vivo) separately to form a dictionary formed from experimental instead of simulated data. However, the conditions under which measurements supposed to generate MRF dictionary entries are performed might differ from those that are used to measure their responses in MRF applications.

The experimental conditions between the MRF calibration and application measurement might significantly differ (regarding the specific B0 environment, temperature, etc.) resulting in completely different signal responses to the same fingerprinting sequence in both cases making a match of the signals from the same tissue or material in extreme cases impossible.

Therefore, this invention describes a way to determine fingerprint signals empirically from in-vivo or ex-vivo tissue samples using a specially designed MRF apparatus and to build dictionaries from these signals. The apparatus makes it possible to generate different B0 field and temperature variations (etc.), thereby producing a number of MRF dictionary entries for different environmental conditions. The dictionary can later be used in a standard MRF setup to precisely characterize tissues.

Examples may contain one or more of the following features:
1. An MRI system including a magnetic field coil for generation of a homogeneous offset magnetic field
2. A computer system and software to measure fingerprint signals based on a fingerprint sequence and to compile a fingerprint dictionary
3. A hardware interface allowing the software to control the magnetic offset field in the imaging volume
4. A set of known tissue samples which have been or will be characterized histologically Examples may include an MRI system which is equipped with an additional device supporting MRF tissue response calibration. Such a device is depicted in FIG. 5.

Figure 5:
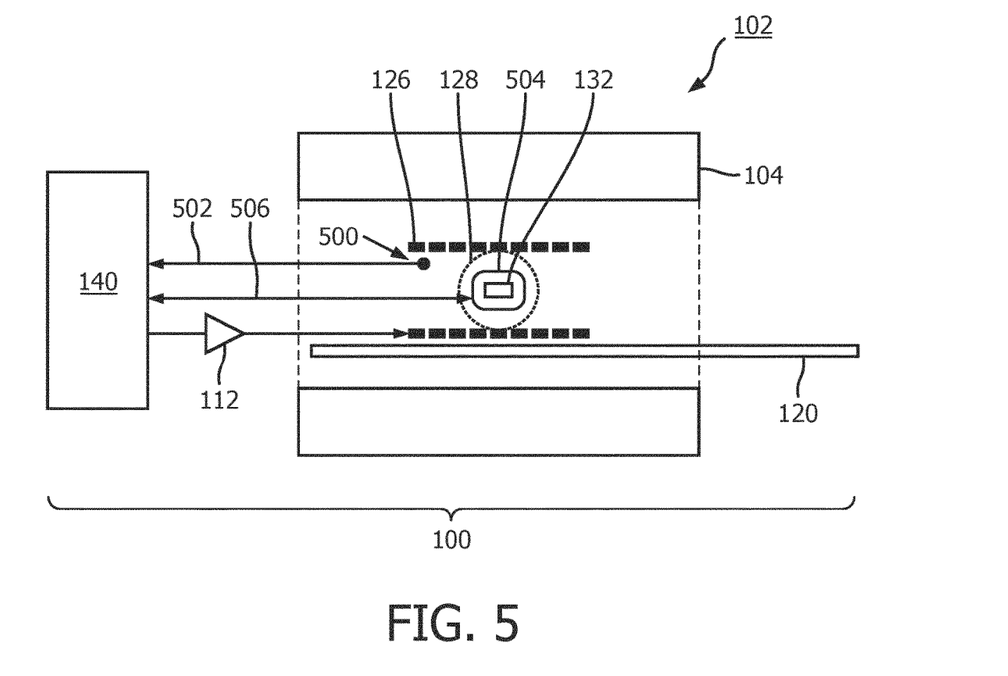
FIG. 5 illustrates several modifications of the magnetic resonance system of FIG. 1.

FIG. 5 shows a further example of the instrument 100. Not all of the features of FIG. 1 are shown in FIG. 5. FIG. 5 illustrates some additional features which may be added to the instrument. FIG. 5 shows the addition of a field probe 500 which is able to provide a field measurement 502 to the computer 140. The field probe 500 may be used as part of a feedback loop to better control the modification of the main magnetic field using the supplementary magnetic field coil 126 or the gradient coils 110. The instrument 100 is also shown as additionally containing a temperature control unit 504. The temperature control unit 504 is controlled by a temperature control connection 506 which is connected to the computer 140. The temperature control unit 504 may contain a heating or cooling element which is used to control the temperature of the test sample 132. This may be used to construct a magnetic resonance fingerprinting dictionary which has entries for individual temperatures.

In FIG. 5, the tissue probe or test sample is placed inside the device with computer controlled and linked to the MR system. A field probe, optional inside the device, may be included to deliver a feedback signal to the control system. Additionally a temperate regulating and control system and other gimmicks are part of the device.

This device could be equipped with an additional field coil which is constructed in such a way that it produces a homogeneous B0 offset field in z direction within the imaging volume. The coil could be constructed as a solenoid, a Helmholtz configuration, or a configuration of separated coil winding blocks similar to an MR magnet. The device could further be equipped with one or more of the following:

- a field sensing probe,
- a temperature control unit to keep the sample to be measured at defined temperature which can be changed during the course of the measurements,
- an own high-SNR reception antenna/unit using solenoid or parallel reception technology (if this is not present, the MR system's reception antennas could be used instead).

The fingerprint sequence used in examples does not necessarily need to follow any regular pattern, and does not need to be reproduced easily by MR simulation software. RF amplitude, RF phase, as well as gradient amplitudes can be arbitrary functions of time, but preferably those types of sequences should be chosen which ensure maximum signal response diversity. MRF sequences leading to "complicated" spin responses which cannot be calculated easily are preferred, since they can encode a large number of tissue parameters, thereby producing unique fingerprints. Therefore, sampling of the MRF signal is also not restricted to certain points in time but can be done at arbitrary times during the sequence.

Figure 6:
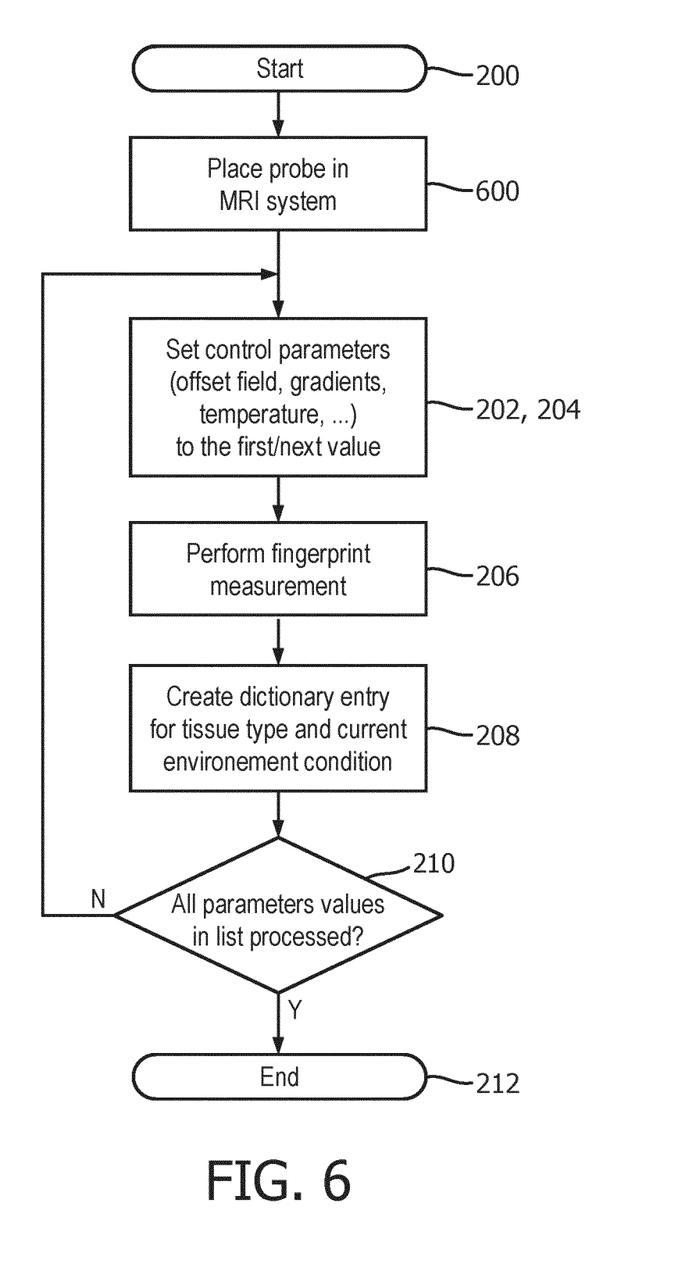
FIG. 6 shows a flow chart which illustrates an example of a method.

FIG. 6 shows a flowchart of a method of controlling an instrument. The flowchart shown in FIG. 6 may be considered to be equivalent to the flowchart of FIG. 2. First in step 200 the method starts. Next in step 600 the probe or test fixture is placed into the magnetic resonance or magnetic resonance imaging system. Next in steps labeled 202 and 204 the control parameters are set. This may be for example setting an offset field adjusting the gradient coils and/or the temperature to a first or next selected value. Next in step 206 the dictionary magnetic resonance data is acquired. Then in step 208 a dictionary entry is created for a particular tissue type and current environmental condition that were specified in steps 202 and 204. The method then proceeds to decision box 210 with the question "have all parameter variations been measured? If the answer is no, then the method returns back to the block labeled 202 and 204. If the answer is yes then the construction of the dictionary has been at least for this time period completed and the method proceeds to step 212 where the method ends.

The workflow of dictionary generation is depicted in FIG. 6. Fingerprinting measurements are performed for a number of different environmental conditions (B0 offset fields and possibly B0 inhomogeneity) with the MR system and the device in place. For this purpose the corresponding extra B0 offset fields are generated on demand by the field coils in the device. Note that off-resonance can also be realised by manipulating the resonance frequency of the MR system with respect to the Larmor frequency.

Each measurement is used as an MRF dictionary entry assigned to the tissue type under inspection and slightly different experimental conditions. These measurements are performed preferably at body temperature, but also this parameter can be varied additionally on top of the off-resonance to generate more entries for the dictionary.

The tissue type under consideration must be known or must be identified by subsequent histological or other investigation. The corresponding entries of the MRF dictionary are then labelled according to the known tissue type.

In this way, a dictionaries containing entries for different organs, tumor types or stages, or any other tissue classification can be generated.

In one embodiment, the magnetic offset field coil is equipped with a field probe to provide a feedback signal to the control electronics in order to set the required magnetic field more accurately.

In one embodiment, not only different constant magnetic offset fields are used to produce different MRF signals, but also different gradient fields are applied during the measurements. In this way, environmental conditions with strong spatial B0 variation are simulated.

In one embodiment, different tissue probes are processed one after the other.

In one embodiment, different tissue probes are measured simultaneously, where the signals from different voxels correspond to the different probes. The dictionary is filled with entries for all tissue probes.

In one embodiment, tissue probes are sampled in-vivo with a patient or other living subject being (partly) placed inside the offset field coil. This may be of advantage, since some tissue parameters may change when a tissue probe is extracted and analysed ex-vivo.

In a further refinement of this idea the experimentally determined dictionary entries can be matched to simulated Bloch based dictionaries to map the tissues to quantitative numbers/properties.

A further refinement of this idea is to merge conventional dictionaries generated via Bloch simulations with those generated via experimental data. A corresponding selection mechanism could be implemented depending on if the user is eager to use MRF to identify tissue properties tuples (quantitative numbers—applicable only to simulated dictionary data) or tissue classification information (all data).

To further improve the quality of the calibrated dictionary, multiple averages can be acquired for each tissue/parameter setting combination, leading to higher SNR.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 instrument
102 magnetic resonance system
104 magnet
106 bore of magnet
108 measurement zone or imaging zone
108' data acquisition zone
110 magnetic field gradient coils
112 magnetic field gradient coil power supply
114 radio-frequency coil
116 transceiver
120 subject support
122 actuator
124 test fixture
126 supplementary magnetic field coil
128 magnetic resonance antenna
130 sampling zone
132 test sample
134 direction of B0 magnetic field lines in sampling zone
136 direction of B1 magnetic field lines in sampling zone
140 computer system
142 hardware interface
144 processor
146 user interface
148 computer storage
150 computer memory
152 pulse sequence commands
154 dictionary magnetic resonance data
156 magnetic resonance fingerprinting dictionary
160 control module
162 magnetic resonance fingerprint dictionary generating module
200 start
202 choose an electrical current from a distribution of electrical currents
204 supply the electrical current to the supplementary magnetic field coil to adjust the main magnetic field within the measurement zone
206 acquiring dictionary magnetic resonance data from the test sample with the magnetic resonance antenna by controlling the magnetic resonance system with pulse sequence commands during the supplying of the electrical current to the supplementary magnetic field coil
208 appending the dictionary magnetic resonance data to a magnetic resonance fingerprinting dictionary
210 "have all parameter variations been measured?
212 end
300 instrument
302 magnetic resonance apparatus
304 subject
306 magnetic resonance imaging antenna
308 pulse sequence instructions
310 subject magnetic resonance data
312 magnetic resonance fingerprinting image data
320 magnetic resonance fingerprinting module
400 place a subject in a data acquisition zone of a magnetic resonance apparatus
402 acquire subject magnetic resonance data by controlling the magnetic resonance apparatus with pulse sequence instructions
404 calculate the abundance of each of a set of predetermined substances by comparing the magnetic resonance data with the magnetic resonance fingerprinting dictionary
500 field probe
502 field measurement
504 temperature control unit
506 temperature control connection
600 place probe or test fixture into magnetic resonance system

The invention claimed is:

1. A method of operating an instrument, wherein the instrument comprises:

a magnetic resonance system for measuring dictionary magnetic resonance data from a measurement zone, wherein the magnetic resonance system comprises a magnet for generating a main magnetic field within the measurement zone; and a test fixture for holding a test sample within the measurement zone, wherein the test fixture comprises a supplementary magnetic field coil and a magnetic resonance antenna;

wherein the method comprises the steps of repeatedly:

choosing an electrical current from a distribution of electrical currents;

supplying the electrical current to the supplementary magnetic field coil to adjust the main magnetic field within the measurement zone;

acquiring the dictionary magnetic resonance data from the test sample with the magnetic resonance antenna by controlling the magnetic resonance system with pulse sequence commands during the supplying of the electrical current to the supplementary magnetic field coil, wherein the pulse sequence commands cause the magnetic resonance system to acquire the dictionary magnetic resonance data according to a magnetic resonance fingerprinting technique, wherein the pulse sequence commands specify a train of pulse sequence repetitions, wherein each pulse sequence repetition has a repetition time chosen from a distribution of repetition times, wherein each pulse sequence repetition comprises a radio frequency pulse chosen from a distribution of radio frequency pulses, wherein the distribution of radio frequency pulses cause magnetic spins to rotate to a distribution of flip angles, and wherein each pulse sequence repetition comprises a sampling event where the magnetic resonance signal is sampled for a predetermined duration at a sampling time before the end of the pulse sequence repetition, wherein the sampling time is chosen from a distribution of sampling times, wherein the dictionary magnetic resonance data is acquired during the sampling event; and appending the dictionary magnetic resonance data to a magnetic resonance fingerprinting dictionary.

2. The method of claim 1, wherein the a magnetic resonance antenna is a solenoid magnetic resonance antenna, wherein solenoid magnetic resonance antenna is configured for generating a B1 magnetic field in a sampling zone, wherein the solenoid magnetic resonance imaging antenna is orientated such that the generated B1 magnetic field is perpendicular to the main magnetic field, wherein the sampling zone is within the measurement zone, and wherein the test sample is within the sampling zone.

3. The method of claim 1, wherein the method further comprises:
placing a subject in a data acquisition zone of a magnetic resonance apparatus;
acquiring subject magnetic resonance data by controlling the magnetic resonance apparatus with pulse sequence instructions, wherein the pulse sequence instructions cause the magnetic resonance apparatus to acquire the subject magnetic resonance data according to the magnetic resonance fingerprinting technique, wherein the pulse sequence instructions specifies the train of pulse sequence repetitions; and
calculating an abundance of each of a set of predetermined substances by comparing the subject magnetic resonance data with the magnetic resonance fingerprinting dictionary, and wherein the test sample belongs to the set of predetermined substances.

4. An instrument comprising:
a magnetic resonance system for measuring dictionary magnetic resonance data (154) from a measurement zone, wherein the magnetic resonance system comprises a magnet for generating a main magnetic field within the measurement zone; and
a test fixture for holding a test sample within the measurement zone, wherein the test fixture comprises a supplementary magnetic field coil and a magnetic resonance imaging antenna
a memory for storing machine executable instructions and pulse sequence commands, wherein the pulse sequence commands cause the magnetic resonance system to acquire the dictionary magnetic resonance data according to a magnetic resonance fingerprinting technique, wherein the pulse sequence commands specifies a train of pulse sequence repetitions, wherein each pulse sequence repetition has a repetition time chosen from a distribution of repetition times, wherein each pulse sequence repetition comprises a radio frequency pulse chosen from a distribution of radio frequency pulses, wherein the distribution of radio frequency pulses cause magnetic spins to rotate to a distribution of flip angles, and wherein each pulse sequence repetition comprises a sampling event where the magnetic resonance signal is sampled for a predetermined duration at a sampling time before the end of the pulse sequence repetition, wherein the sampling time is chosen from a distribution of sampling times, wherein the dictionary magnetic resonance data is acquired during the sampling event;
a processor for controlling the instrument;
wherein execution of the machine executable instructions further causes the processor to repeatedly:
choose an electrical current from a distribution of electrical currents;
control the instrument to supply the electrical current to the supplementary magnetic field coil to adjust the main magnetic field of the test sample;
acquire dictionary magnetic resonance data by controlling the magnetic resonance system with pulse sequence commands during the supplying of the electrical current to the supplementary magnetic field coil; and
append the dictionary magnetic resonance data to a magnetic resonance fingerprinting dictionary.

5. The instrument of claim 4, wherein the magnetic resonance system further comprises a magnetic gradient system configured for generating gradient magnetic fields in at least one direction.

6. The instrument of claim 5, wherein execution of the machine executable instructions further cause the processor to repeatedly:
choose a B0 inhomogenity profile from a distribution of B0 inhomogenity profiles;
control the magnetic gradient system to generate a constant gradient magnetic field to simulate the B0 inhomogeneity profile, and wherein the dictionary magnetic resonance data is acquired during the generation of the constant gradient magnetic field.

7. The instrument of claim 4, wherein the magnetic resonance system is a magnetic resonance imaging system, wherein the magnetic field gradient system is configured for generating the gradient magnetic fields in three orthogonal directions, wherein the magnetic field gradient system is further configured for generating a phase encoding gradient magnetic field within the measurement zone to spatially encode the magnetic resonance data in the three directions during the sampling event, wherein the spatial encoding divides the magnetic resonance data into discrete voxels.

8. The instrument of claim 4, wherein execution of the machine executable instructions further causes the processor to calculate at least a portion of the magnetic resonance fingerprinting dictionary by modeling each of a set of predetermined substances as one or more spins with selected Bloch equations.

9. The instrument of claim 4, wherein the pulse sequence commands comprise instructions to vary the gradient magnetic fields during the application of at least one of the radio frequency pulse of at least one pulse sequence repetition.

10. The instrument of claim 4, wherein the pulse sequence commands comprise instructions that cause the radio frequency pulse of at least one pulse sequence repetition to be longer than 15 milliseconds.

11. The instrument of claim 4, wherein execution of the machine executable instructions further causes the processor to:
numerically fit a solution of initial Bloch equations to the dictionary magnetic resonance data to generate a set of corrected Bloch equations;
wherein execution of the machine executable instructions further cause the processor to repeatedly:
modify at least one parameter of the corrected Bloch equations;
solve the corrected Bloch equations to generate calculated magnetic resonance data; and
append the calculated magnetic resonance data to the magnetic resonance fingerprinting dictionary.

12. The instrument of claim 4, wherein the instrument further comprises a temperature control system for controlling the temperature of the test sample during acquisition of the dictionary magnetic resonance data.

13. The instrument of claim 12, wherein execution of the machine executable instructions further cause the processor to repeatedly:
choose a measurement temperature from a distribution of temperatures; and
control the temperature control system to maintain the test sample at the measurement temperature, wherein the dictionary magnetic resonance data is acquired when the test sample is within a predetermined temperature range that includes the measurement temperature.

14. The instrument of claim 4, wherein the test fixture further comprises a magnetic field sensor for measuring a measured magnetic field strength within the imaging zone, wherein the electrical current is specified for a desired magnetic field strength, wherein execution of the machine executable instructions further cause the processor to:
control the magnetic field sensor to measure the magnetic field strength; and
control the instrument to adjust the electrical current to the supplementary magnetic field coil and/or to at least one of the gradient coils such that the difference between the measured magnetic field strength and the desired magnetic field strength is below a predetermined amount.

15. A non-transitory computer readable medium configured to store machine executable instructions for execution by a processor controlling an instrument, wherein the instrument comprises a magnetic resonance system for measuring magnetic resonance data from a measurement zone, wherein the magnetic resonance system comprises a magnet for generating a main magnetic field within the measurement zone, wherein the instrument further comprises a test fixture for holding a test sample within the measurement zone, wherein the test fixture comprises a supplementary magnetic field coil and a magnetic resonance imaging antenna, wherein execution of the machine executable instructions further causes the processor to repeatedly:
choose an electrical current from a distribution of electrical currents;
control the instrument to supply the electrical current to the supplementary magnetic field coil to adjust the main magnetic field of the test sample;
acquire dictionary magnetic resonance data by controlling the magnetic resonance system with pulse sequence commands during the supplying of the electrical current to the supplementary magnetic field coil, wherein the pulse sequence commands cause the magnetic resonance system to acquire the dictionary magnetic resonance data according to a magnetic resonance fingerprinting technique, wherein the pulse sequence commands specifies a train of pulse sequence repetitions, wherein each pulse sequence repetition has a repetition time chosen from a distribution of repetition times, wherein each pulse sequence repetition comprises a radio frequency pulse chosen from a distribution of radio frequency pulses, wherein the distribution of radio frequency pulses cause magnetic spins to rotate to a distribution of flip angles, and wherein each pulse sequence repetition comprises a sampling event where the magnetic resonance signal is sampled for a predetermined duration at a sampling time before the end of the pulse sequence repetition, wherein the sampling time is chosen from a distribution of sampling times, wherein the dictionary magnetic resonance data is acquired during the sampling event; and
append the dictionary magnetic resonance data to a magnetic resonance fingerprinting dictionary.

16. The instrument of claim 4, wherein the pulse sequence commands comprise instructions that cause the radio frequency pulse of at least one pulse sequence repetition to be longer than 50 milliseconds.

* * * * *